United States Patent
Tam et al.

(10) Patent No.: US 9,748,460 B2
(45) Date of Patent: Aug. 29, 2017

(54) LED BACK END ASSEMBLY AND METHOD OF MANUFACTURING

(71) Applicant: Flextronics AP, LLC, Broomfield, CO (US)

(72) Inventors: Samuel Tam, Daly City, CA (US); Murad Kurwa, San Jose, CA (US); Shing Dick Pang Tak, Tsuen Wan (HK)

(73) Assignee: Flextronics AP, LLC, Broomfield, CO (US)

( * ) Notice: Subject to any disclaimer, the term of this patent is extended or adjusted under 35 U.S.C. 154(b) by 0 days.

(21) Appl. No.: 14/192,744

(22) Filed: Feb. 27, 2014

(65) Prior Publication Data

US 2014/0239342 A1    Aug. 28, 2014

Related U.S. Application Data

(60) Provisional application No. 61/770,930, filed on Feb. 28, 2013.

(51) Int. Cl.
| | |
|---|---|
| *H01L 33/00* | (2010.01) |
| *H01L 33/64* | (2010.01) |
| *F21K 9/90* | (2016.01) |
| *H01L 33/62* | (2010.01) |
| *F21V 29/77* | (2015.01) |

(Continued)

(52) U.S. Cl.
CPC ............... *H01L 33/64* (2013.01); *F21K 9/90* (2013.01); *F21K 9/20* (2016.08); *F21V 29/773* (2015.01); *F21Y 2115/10* (2016.08); *H01L 33/62* (2013.01); *H01L 2924/0002* (2013.01)

(58) Field of Classification Search
CPC ................................ H01L 33/62; H01L 33/64
USPC .................. 257/99, 692, 712; 438/26, 122
See application file for complete search history.

(56) References Cited

U.S. PATENT DOCUMENTS

| | | | |
|---|---|---|---|
| 4,729,076 A | 3/1988 | Masami et al. | |
| 4,771,824 A | 9/1988 | Rojey et al. | |
| 5,632,551 A | 5/1997 | Roney et al. | |

(Continued)

FOREIGN PATENT DOCUMENTS

| | | |
|---|---|---|
| DE | 102009034841 | 2/2011 |
| WO | 2011093614 A2 | 8/2011 |

OTHER PUBLICATIONS

Non-final office action dated Feb. 24, 2017, U.S. Appl. No. 13/921,028, filed Jun. 18, 2013, applicant: Jordan Musser, 10 pages.

*Primary Examiner* — Jamie C Niesz
(74) *Attorney, Agent, or Firm* — Haverstock & Owens LLP

(57) ABSTRACT

An LED device and method of manufacture including separately coupling a thin flexible interposer and an LED die to a heat sink structure and then electrically coupling the interposer and the LED die together with a wirebond. A specifically shaped perimeter of an aperture within the interposer negates the need for a cavity or alignment markings within the heat sink structure by limiting the orientation in which the die fits within the aperture. Alternatively, an LED device and method of manufacture include coupling a rigid circuit board to an LED die such that electrical contacts of the die are electrically coupled with electrical input/output terminals of the circuit board. This die/board unit is then able to be coupled to a heat sink structure to form a portion of the device.

12 Claims, 11 Drawing Sheets

(51) Int. Cl.
*F21K 9/20* (2016.01)
*F21Y 115/10* (2016.01)

(56) References Cited

U.S. PATENT DOCUMENTS

| | | | |
|---|---|---|---|
| 5,890,794 | A | 4/1999 | Abtahi et al. |
| 7,210,832 | B2 | 5/2007 | Huang |
| 7,259,403 | B2 * | 8/2007 | Shimizu .................... F21L 4/00 257/100 |
| 7,611,261 | B2 | 11/2009 | Richmond et al. |
| 8,033,716 | B1 | 10/2011 | Tandy et al. |
| 8,070,325 | B2 | 12/2011 | Zampini et al. |
| 8,227,269 | B2 | 7/2012 | Chen et al. |
| 8,378,559 | B2 | 2/2013 | Shuja et al. |
| 8,439,534 | B1 | 5/2013 | Roe et al. |
| D687,179 | S | 7/2013 | Kim |
| 8,591,051 | B2 | 11/2013 | Nakajima et al. |
| 8,661,660 | B2 | 3/2014 | Ter-Hovhannissian |
| 2001/0042865 | A1 | 11/2001 | Oshio et al. |
| 2004/0062031 | A1 | 4/2004 | Pinter |
| 2005/0007769 | A1 | 1/2005 | Bonzer et al. |
| 2006/0044806 | A1 | 3/2006 | Abramov et al. |
| 2006/0186423 | A1 * | 8/2006 | Blonder .............. H01L 25/0753 257/98 |
| 2006/0186430 | A1 | 8/2006 | Park et al. |
| 2007/0028626 | A1 | 2/2007 | Chen |
| 2008/0048200 | A1 | 2/2008 | Mueller et al. |
| 2009/0179207 | A1 | 7/2009 | Chitnis et al. |
| 2009/0272136 | A1 | 11/2009 | Knoll et al. |
| 2010/0097780 | A1 | 4/2010 | Beatenbough et al. |
| 2010/0295070 | A1 | 11/2010 | Su et al. |
| 2010/0295077 | A1 | 11/2010 | Melman |
| 2011/0018017 | A1 | 1/2011 | Bierhuizen et al. |
| 2011/0051413 | A1 | 3/2011 | Hand |
| 2011/0085336 | A1 | 4/2011 | Blumel et al. |
| 2011/0204780 | A1 * | 8/2011 | Shum .................... H05K 1/189 315/35 |
| 2011/0228517 | A1 | 9/2011 | Kawabat et al. |
| 2012/0007506 | A1 * | 1/2012 | Ohmi .................. F21S 48/1104 315/77 |
| 2012/0019137 | A1 | 1/2012 | Safarikas et al. |
| 2012/0097985 | A1 | 4/2012 | Liu et al. |
| 2012/0120667 | A1 | 5/2012 | Schenkl |
| 2012/0205697 | A1 | 8/2012 | Kim et al. |
| 2012/0218746 | A1 | 8/2012 | Winton |
| 2013/0027906 | A1 | 1/2013 | Ueda et al. |
| 2013/0155674 | A1 | 6/2013 | Park et al. |
| 2014/0001496 | A1 | 1/2014 | Musser et al. |
| 2014/0003053 | A1 | 1/2014 | Musser et al. |
| 2014/0043810 | A1 | 2/2014 | Jo et al. |
| 2014/0119032 | A1 | 5/2014 | Wimbert et al. |
| 2015/0016123 | A1 | 1/2015 | Musser et al. |

* cited by examiner

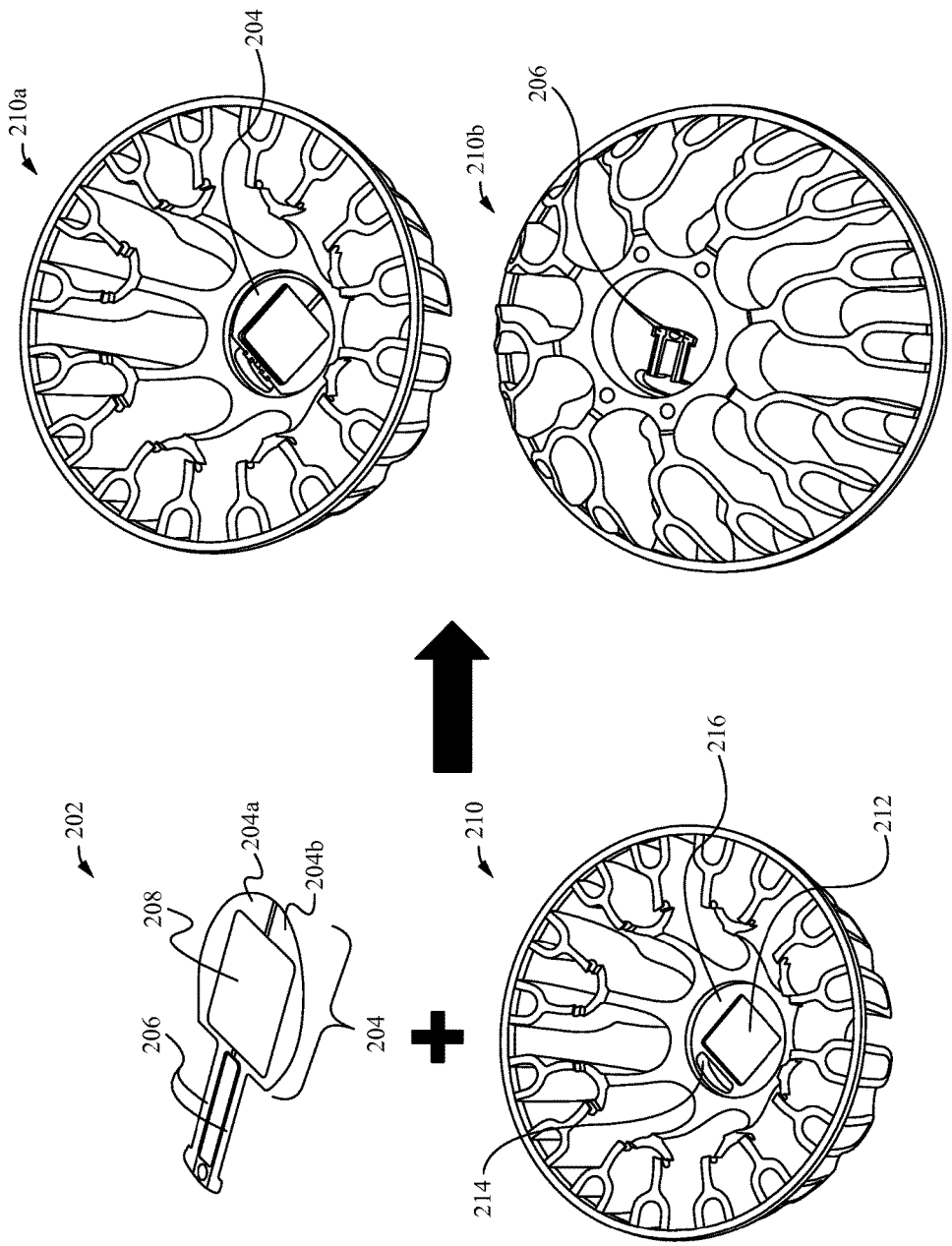

LED BACK END ASSEMBLY AND METHOD OF MANUFACTURING

RELATED APPLICATIONS

This Patent Application claims priority under 35 U.S.C. 119 (e) of the U.S. Provisional Application Ser. No. 61/770,930, filed Feb. 28, 2013, and entitled "LED Back End Assembly and Method of Manufacturing," which is hereby incorporated by reference.

FIELD OF THE INVENTION

The present invention is generally directed to the field of light emitting diodes. More specifically, the present invention is directed to a light-emitting diode apparatus.

BACKGROUND OF THE INVENTION

A light-emitting diode (LED) is a semiconductor light source. LEDs are increasingly being used in a wide variety of lighting applications. LEDs continue growing in popularity due in part to their efficiency and extended lifetimes. An LED-based light source typically includes one or more LED dies mounted on a substrate interposer within a housing via solder. However, due to the small pad geometry of the die, the tolerances and positioning of the die/interposer within the housing can be difficult and further the solder volume is not able to maintain a high enough standoff between the die and an interconnection to other circuitry. As a result, the assembly process and therefore the LED-based light source itself is costly and prone to defects.

SUMMARY OF THE INVENTION

Embodiments of an LED device and method of manufacture are directed to separately coupling a thin flexible interposer and an LED die to a heat sink structure and then electrically coupling the interposer and the LED die together with a wirebond. As a result, only a single interposer is necessary and problems with standoff size are substantially eliminated. Further, a specifically shaped perimeter of an aperture within the interposer negates the need for a cavity or alignment markings within the heat sink structure by limiting the orientation in which the die fits within the aperture. Thus, heat sink manufacturing cost is saved. Further, embodiments of an LED device and method of manufacture are directed to coupling a rigid circuit board to an LED die such that electrical contacts of the die are electrically coupled with electrical input/output terminals of the circuit board. This die/board unit is then able to be coupled to a heat sink structure to form a portion of the device. In particular, the rigidity of the circuit board enable an entire array of LED die/circuit boards to be simultaneously or concurrently manufactured on a single panel and then singulated. This results in assembly efficiency and therefore reduced costs. Moreover, studs or bumps are able to be fabricated on the LED dies in order to electrically couple with the terminals of the circuit board, wherein the bumps are able to provide a better standoff than previously possible.

A first aspect is directed to a method of manufacturing an LED device. The method comprises physically coupling an interposer to a first portion of a heat sink structure, physically coupling an LED die to a second portion of the heat sink structure adjacent to the first portion and electrically coupling the LED die to the interposer. In some embodiments, electrically coupling of the LED die to the interposer comprises forming one or more wirebonds between the LED die and the interposer. In some embodiments, the method further comprises enveloping the wirebonds in a protective mold. In some embodiments, the interposer comprises a thin flexible body having an aperture and the second portion is located within the aperture. In some embodiments, the aperture is square or rectangular such that the alignment of the LED die within the aperture is limited. In some embodiments, the interposer comprises one or more terminals that form conductive conduits that extend away from the body for electrically coupling to a second circuit. In some embodiments, physically coupling the interposer to the heat sink structure comprises threading the terminals through a hole within the heat sink structure adjacent to the first portion. In some embodiments, the method further comprises physically coupling a secondary circuit to the heat sink structure such that one or more conductive contacts of the secondary circuit electrically couple with one or more of the terminals of the interposer.

A second aspect is directed to an LED lighting device. The device comprising a heat sink structure, an interposer physically coupled to a first portion of the heat sink structure, an LED die physically coupled to a second portion of the heat sink structure adjacent to the first portion and one or more conductors that electrically couple the LED die to the interposer. In some embodiments, the one or more conductors comprise wirebonds. In some embodiments, the device further comprises protective mold bumps that envelope each of the wirebonds. In some embodiments, the interposer comprises a thin flexible body having an aperture and the second portion is located within the aperture. In some embodiments, the aperture is square or rectangular such that the alignment of the LED die within the aperture is limited. In some embodiments, the interposer comprises one or more terminals that form conductive conduits that extend away from the body for electrically coupling to a second circuit. In some embodiments, the terminals are threaded through a hole within the heat sink structure adjacent to the first portion. In some embodiments, the device further comprises a secondary circuit physically coupled to the heat sink and having one or more conductive contacts that are electrically coupled with one or more of the terminals of the interposer.

A third aspect is directed to a method of manufacturing an LED device. The method comprises forming a plurality of LED dies each having one or more die contact pads and at least one conductive bump on each of the die contact pads, bonding the LED dies to a rigid printed circuit board such that the conductive bumps electrically couple the die contact pads with one or more terminals of the printed circuit board, singulating the printed circuit board into a plurality of packages such that each package comprises one of the dies and one or more of the terminals electrically coupled to the one of the dies and physically coupling one of the packages to a heat sink structure such that the one or more of the terminals of the package align with a hole within the heat sink structure. In some embodiments, bonding of the LED die to the printed circuit board comprises aligning the conductive bumps with one or more board contact pads of the printed circuit board while also aligning a light-emitting portion of the die with an aperture within the printed circuit board. In some embodiments, bonding of the LED die to the printed circuit board comprises filling the area in between the LED die and the printed circuit board with an underfill material that seals the LED die to the printed circuit board. In some embodiments, the singulating comprises punch singulation where the packages are physically separated from the remainder of the board at one or more support stems. In some embodiments, physically coupling the one of the packages to the heat sink structure comprises positioning the die of the package within a cavity within the heat sink structure. In some embodiments, the cavity is square or rectangular such that the alignment of the die when positioned within the cavity is limited. In some embodiments, the method further comprises physically coupling a secondary circuit to the heat sink structure such that one or more conductive contacts of the secondary circuit electrically couple with the one or more of the terminals of the package through the hole of the heat sink structure.

A fourth aspect is directed to an LED lighting device. The device comprising a heat sink structure, a flat rigid printed circuit board having body and a protrusion that protrudes from one side of the body, wherein the protrusion includes one or more exposed terminals and the body includes one or more conductive board contact pads electrically coupled with the one or more terminals, an LED die having one or more die contact pads and at least one conductive bump on each of the die contact pads, wherein the die is physically coupled to the body of the board such that the conductive bumps are electrically coupled with the terminals via the board contact pads and a heat sink structure physically coupled to the board such that the terminals of the board align with a hole within the heat sink structure. In some embodiments, the board comprises an aperture that aligns with a light-emitting portion of the die such that the light-emitting portion is accessible through the aperture within the board. In some embodiments, the device further comprises an underfill material disposed in the area in between the LED die and the printed circuit board such that the underfill material seals the LED die to the printed circuit board. In some embodiments, the die is positioned within a cavity within the heat sink structure. In some embodiments, the cavity is square or rectangular such that the alignment of the die when positioned within the cavity is limited. In some embodiments, the device further comprises a secondary circuit physically coupled to the heat sink structure such that one or more conductive contacts of the secondary circuit electrically couple with the terminals of the board through the hole of the heat sink structure.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures:

FIG. 2A illustrates an interposer and a heat sink structure according to some embodiments.

FIG. 2B illustrates a top perspective view and a bottom perspective view of the interposer and the heat sink structure coupled together according to some embodiments.

DETAILED DESCRIPTION OF THE EMBODIMENTS

Embodiments of the present application are directed to an LED device and method of manufacture. Those of ordinary skill in the art will realize that the following detailed description of the LED device and method of manufacture is illustrative only and is not intended to be in any way limiting. Other embodiments of the power converter will readily suggest themselves to such skilled persons having the benefit of this disclosure.

Reference will now be made in detail to implementations of the LED device and method of manufacture as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
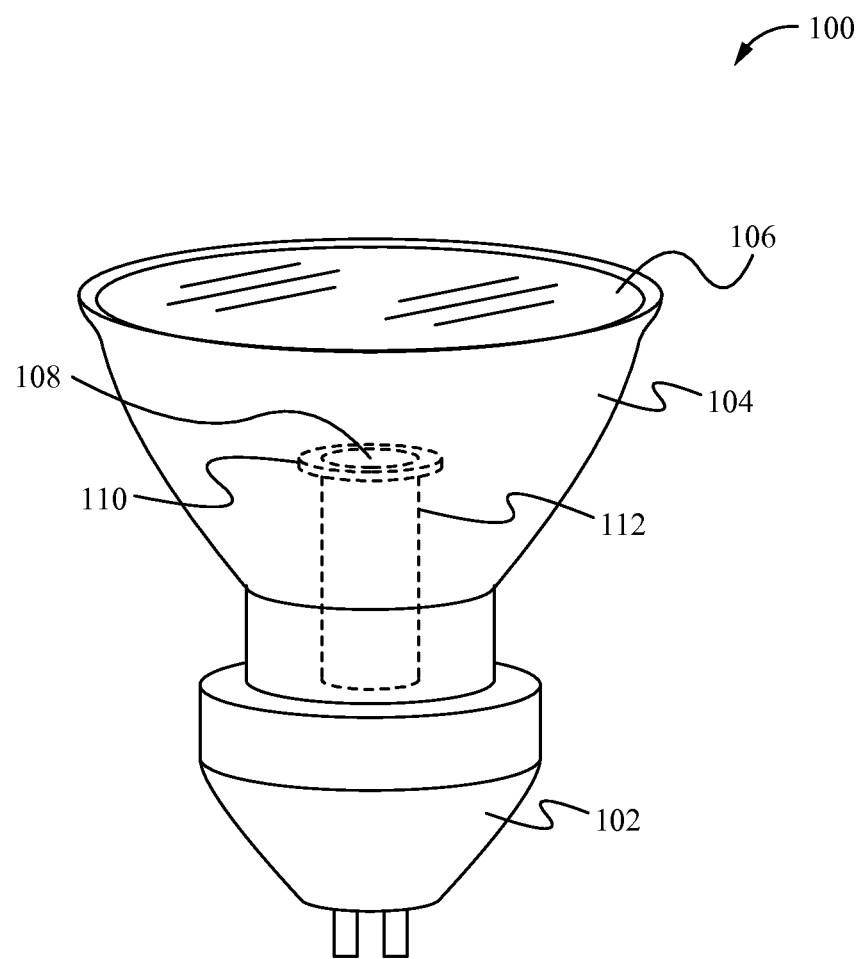
FIG. 1 illustrates an LED lighting device according to some embodiments.

FIG. 1 illustrates an LED lighting device according to some embodiments. As shown in FIG. 1, the lighting device 100 comprises a base 102, a heat sink structure 104, a lens and/or filter 106, an LED die 108, a die substrate 110 and device circuitry 112 all physically coupled with each other. Alternatively, the device 100 is able to comprise more or less components as are well known in the art. For example, in some embodiments the device 100 is able to comprise a cover or upper housing that surrounds the heat sink structure 104 and/or holds the lens 106 in place relative to the heat sink structure 104 and/or the remainder of the device 100. The base 102 of the device 100 is able to at least partially house and support the device circuitry 112. In some embodiments, the device circuitry 112 is able to comprise power converting circuitry, light intensity adjustment (e.g. dimming) circuitry, control circuitry, battery and/or power source circuitry and/or other types a circuitry for use in lighting devices well known in the art. The heat sink structure 104 is positioned adjacent to the lens/filter 106 in order to remove heat emanating from the lens/filter 106. Additionally, the heat sink structure 104 is able to house the die 108 and die substrate 110 and couple with the base 102 such that the die 108 is electrically coupled with the device circuitry 112 via the die substrate 110. For example, the LED die 108 and device circuitry 112 are able to be electrically coupled such that the circuitry 112 is able to provide power to the LED die 108 for producing light. Additionally, the heat sink structure 104 is able to absorb heat from the die 108 and/or substrate 110 thereby cooling the die 108 and/or substrate 110. The die 108 is able to be physically and/or electrically coupled with the die substrate 110. In some embodiments, the die substrate 110 is an interposer or other flexible substrate. Alternatively, the die substrate 110 is able to be a printed circuit board or other rigid substrate. In any case, the die substrate 110 is able to provide structural support and/or an electrical pathway for electrically coupling the die 108 to other circuitry within the device 100.

Figures 2C, 2D:
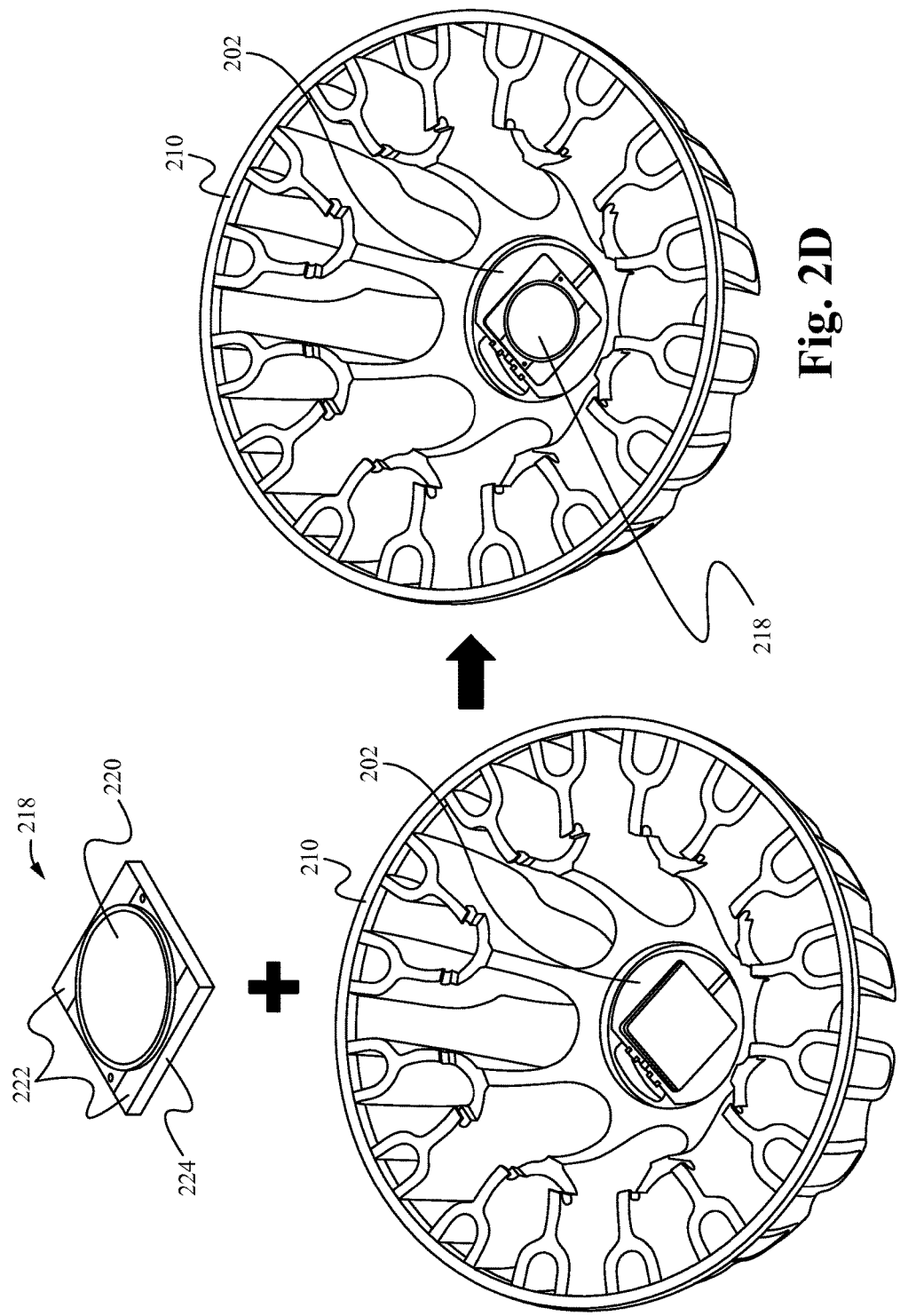
FIG. 2C illustrates perspective views of an LED die and the top view of the interposer coupled to the heat sink structure according to some embodiments.
FIG. 2D illustrates a perspective view of the LED die coupled to the heat sink structure within the aperture of the interposer according to some embodiments.

FIGS. 2A-2F illustrate a method of manufacturing or assembling an LED-lighting device 100 according to some embodiments. As shown in FIG. 2A, an interposer 202 is able to comprise a body 204 and one or more terminals 206 that extend out from the body 204. The body 204 and the terminals 206 are each able to have electrically conductive portions that are electrically coupled together. For example, as shown in FIG. 2A, the body 204 is separated into two electrically conductive portions 204a and 204b that are electrically isolated from each other, but are electrically coupled to one of the two terminals 206 (e.g. an anode terminal and a cathode terminal). Alternatively, the body 204 of the interposer 202 is able to comprise more or less conductive portions 204a, 204b and/or more or less terminals 206. In some embodiments, the interposer 202 comprises one or more terminals 206 for each conductive portion 204a, 204b of the body 204 such that each conductive portion 204a, 204b is electrically coupled with one or more of the terminals 206. As a result, the conductive portions 204a, 204b are able to act as contact pads or traces for transmitting electrical signals to the ends of the terminals 206 and vice versa.

In some embodiments, both sides of the interposer 202 are able to comprise exposed conductive areas (e.g. conductive portions, terminals). Alternatively, only one side of the interposer 202 are able to comprise exposed conductive areas such that the other surface or side is electrically isolating material. As shown in FIG. 2A, the body 204 and terminals 206 of the interposer 202 are able to be flat or planar sheets. In particular, the planar nature of the interposer 202 causes the interposer 202 to be flexible or bendable with respect to its planar dimension while remaining sufficiently rigid to maintain its bent shape. Further, the body 204 of the interposer 202 is able to comprise an interposer aperture 208. The aperture 208 is able to have an outline, shape or perimeter the is the same, but slightly larger than the outline or perimeter of the LED die described below such that the die is able to fit within the aperture 208 when the respective perimeters are aligned. As shown in FIG. 2A, the outline of the aperture 208 is a square shape. This use of a non-circular shape provides the benefit of limiting the number of orientations where the aperture 208 and the die are aligned thereby making alignment of the die relative to the heat sink 210 easier. Alternatively, the outline of aperture 208 is able to be otherwise shaped such as rectangular, diamond, triangular, oval or other shapes as are well known in the art.

As shown in FIG. 2A, the heat sink structure 210 comprises a branching body surrounding an indent 216, a cavity 212 and a hole 214. The branching body of the structure 210 enables the heat sink structure 210 to more effectively absorb heat while also supporting the device 100. The cavity 212 and the hole 214 are able to be located within the indent 216 of the structure 210. In particular, the hole 214 is able to be positioned adjacent to the cavity 212 (where the LED die will be located) in order to minimize the length necessary for the terminals 206 to extend from the cavity 212 through the hole 214 as described below with reference to FIG. 2B. Alternatively, in some embodiments the indent 216 and/or the cavity 212 are able to be omitted. For example, in some embodiments the aperture 208 is able to provide the necessary alignment guides for the LED die such that the indent 216 and/or the cavity 212 are able to be omitted. The indent 216 is able to be sized (e.g. have a depth and/or perimeter) to receive the body 204 of the interposer 202. Similarly, the cavity 212 is able to be sized to match the depth and/or perimeter of the LED die such that the cavity 212 is able to receive the die. As a result, the cavity 212 is able to have substantially the same perimeter (e.g. square) as the aperture 208 of the interposer 202, which provides the advantage of guiding the orientation/alignment of the die within the cavity 212 and/or aperture 208. The hole 214 extends through the body of the heat sink structure 210 to the other side opposite the indent 216 and/or cavity 212. Thus, the hole 214 provides a path for the terminals 206 of the interposer 202 to reach the other side of the heat sink structure 210.

FIG. 2B illustrates a top 210a and bottom 210b perspective of the interposer 202 and the heat sink structure 210 physically coupled together according to some embodiments. As shown in FIG. 2B, the body 204 of the interposer 202 is positioned within the indent 216 of the heat sink 210 such that the aperture 208 aligns with cavity 212 and the terminals 206 are closest to the hole 214. The terminals 206 are threaded through the hole 214 as shown by the top view 210a and bent to wrap around or hug the opposite side of the heat sink structure 210 as shown by the bottom view 210b. As a result, the interposer 202 is able to both physically couple to the heat sink structure 210 and provide an electrical conduit from the top of the structure 210a to the bottom of the structure 210b via the conductive portions 204a, 204b of the body 204 and the terminals 206.

As shown in FIG. 2C, an LED die 218 comprises a body 224 including a light-emitting element 220 and one or more electrically conductive contact pads 222. Specifically, the light-emitting element 220 is electrically coupled with the contact pads 222 such that the element 220 is able to receive electrical signals (e.g. power) via the one or more contact pads 222 and operate (e.g. turn on and off) based on the received signals. Although as shown in FIG. 2C, the LED die 218 comprises two contact pads 222, more or less contact pads 222 are contemplated. In some embodiments, the number of contact pads 222 is equal to the number of conductive portions 204a, 204b and/or the number of terminals 206. As a result, each contact pad 222 is able to be electrically coupled with a terminal 206 via a conductive portion 204a, 204b. In some embodiments, the body 224 has a depth such that the body 224 is able to fit within the cavity 212 and a perimeter that is congruent with but slightly smaller than the perimeter of the aperture 208 and/or the cavity 212. As a result, the body 224 is able to fit within the aperture 208 and/or cavity 212 when oriented correctly as shown in FIG. 2D. In particular, as shown in FIG. 2D, the LED die 218 is able to be physically coupled to the heat sink structure 210 within the aperture 208 of the interposer 202. In some embodiments, the die 218 is physically coupled via an adhesive disposed between the die 218 and the structure 210. Alternatively, the die 218 is able to be physically trapped or secured in place by another structure (e.g. lens/filter) or otherwise affixed relative to the interposer 202 and/or structure 210.

Figure 2E:
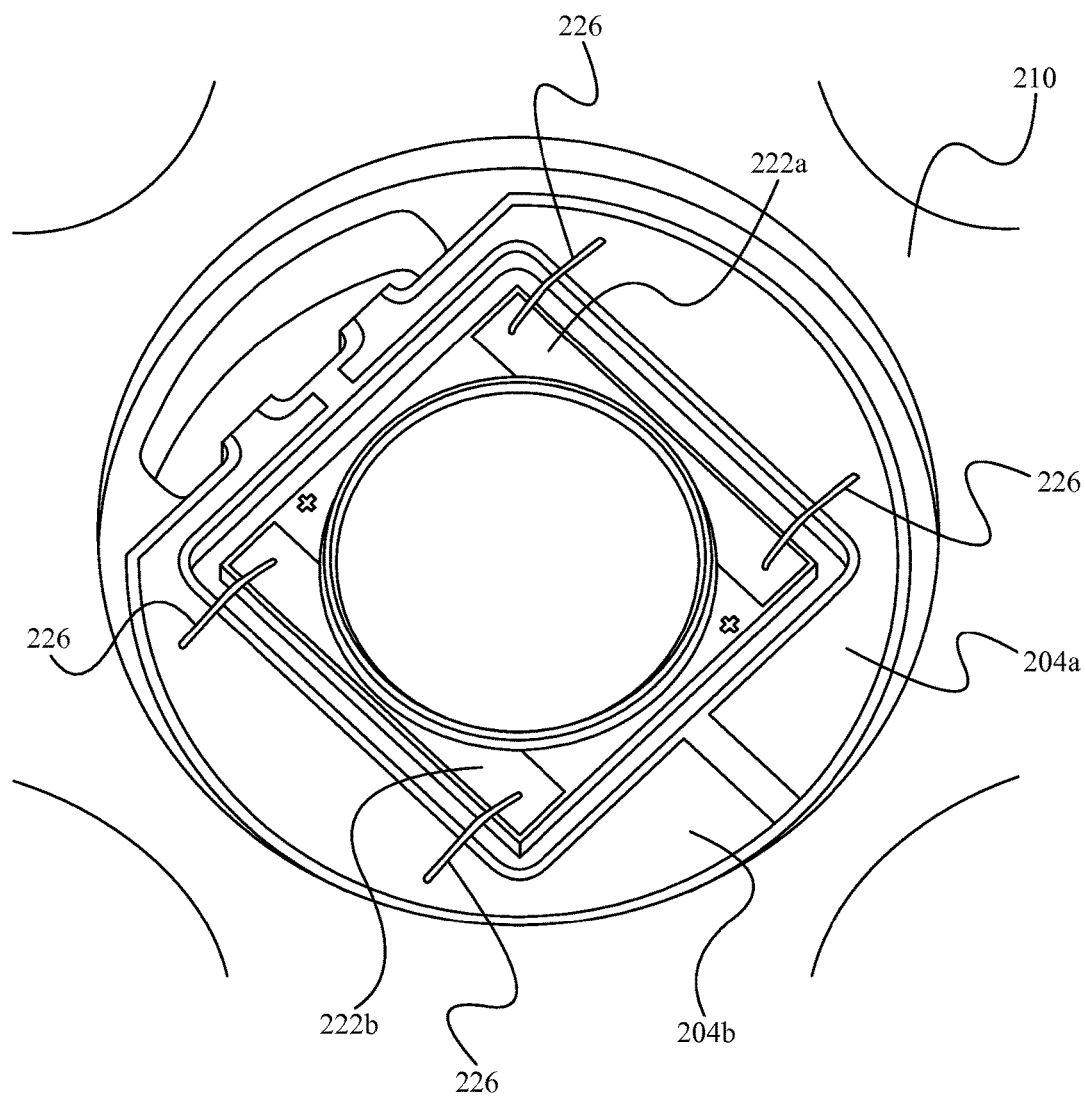
FIG. 2E illustrates a zoomed in view of the LED die positioned within the aperture and/or cavity and electrically coupled with the interposer according to some embodiments.

FIG. 2E illustrates a zoomed in view of the LED die 218 positioned within the aperture 208 and/or cavity 212 and electrically coupled with the interposer 202 according to some embodiments. As shown in FIG. 2E, one or more wirebonds 226 are used to electrically couple the contact pads 222a, 222b of the die 218 to the conductive portions 204a, 204b (and the corresponding terminals 206) of the interposer 202. Alternatively, one or more of the wirebonds 226 are able to be replaced with other electrical coupling elements such as studs/balls or solder connections. As shown in FIG. 2E, multiple wirebonds 226 are used to couple each contact pad 222a, 222b with a corresponding conductive portion 204a, 204b. Alternatively, more or less wirebonds 226 are able to be used to form the desired electrical couplings. In some embodiments, the wirebonds 226 are aluminum. Alternatively, one or more of the wirebonds 226 are able to be other materials such as gold, palladium, silver, nickel, copper or other types of conductive materials known in the art.

Figure 2F:
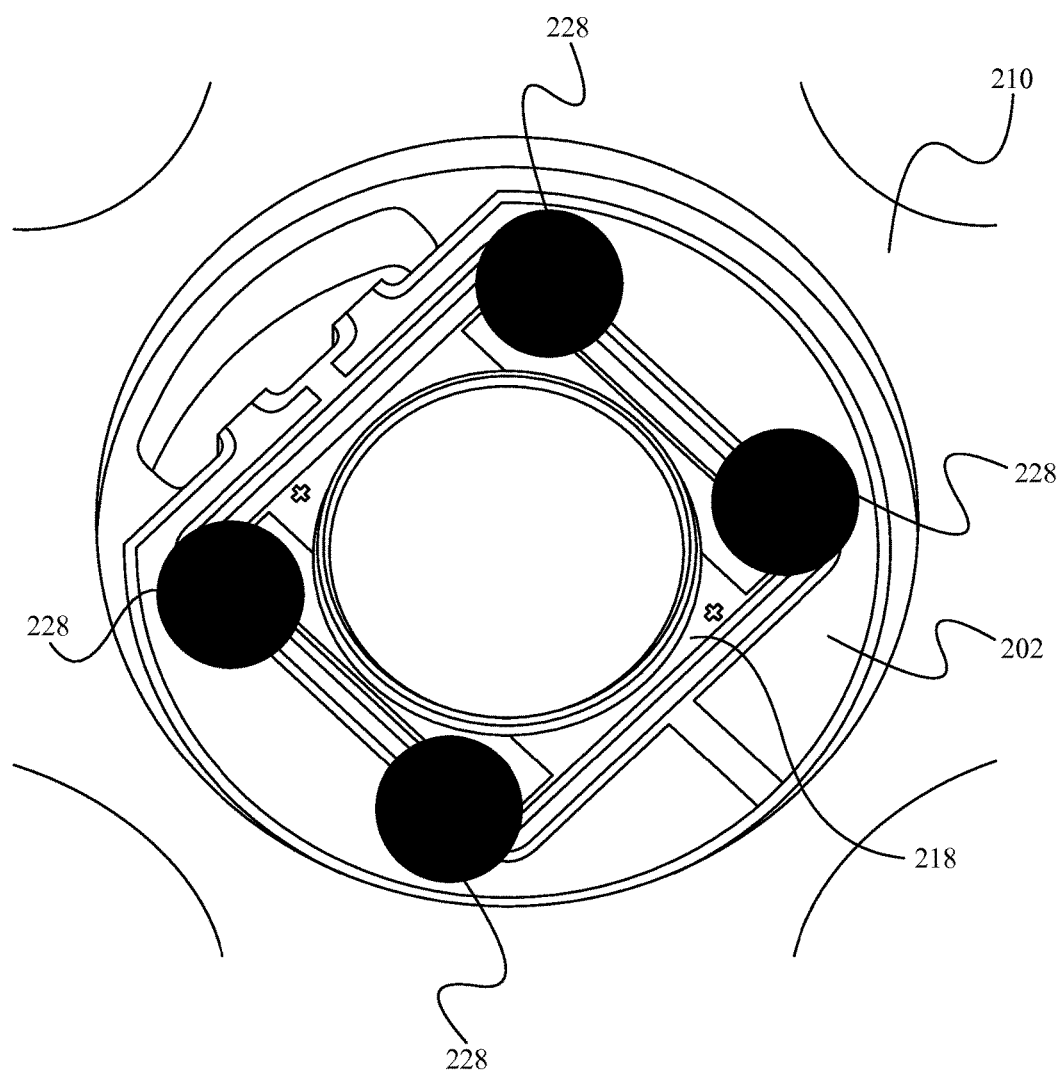
FIG. 2F illustrates a zoomed in view of the LED die electrically coupled with the interposer with the wirebonds covered by protective globs according to some embodiments.

FIG. 2F illustrates a zoomed in view of the LED die 218 electrically coupled with the interposer 202 with the wirebonds 226 covered by protective globs 228 according to some embodiments. As shown in FIG. 2E, each of the one or more wirebonds 226 (and their connection points to the interposer 202 and the die 218) are covered by a protective glob 228. Specifically, the protective globs 228 are able to surround each of the wirebonds 226 and then harden such that the wirebonds 226 are prevented from being severed, disconnected or otherwise damaged such that the electrical pathway is eliminated or degraded. Additionally, in some embodiments one or more of the globs 228 fill a portion of the gap between the die 218, the inner walls of the cavity 212 and/or the interposer 202. As a result, the globs 228 are able to hold the die 218 in place with respect to the cavity 212 and/or the interposer 202. In such embodiments, the globs 228 are able to replace and/or supplement any adhesive or other affixing element used to keep the die 218 in place relative the heat sink structure 210 and/or interposer 202. In some embodiments, the globs 228 comprise a non-conductive thermal epoxy that hardens when cured. Alternatively, one or more of the protective globs 228 are able to be conductive or non-conductive and/or comprise one or more protective materials known in the art.

Accordingly, the resulting heat sink structure 210 with affixed and electrically coupled interposer 202 and LED die 218 is ready for the remainder of assembly of the device 100. In particular, as shown in FIG. 1, the lens/filter 106 is able to be coupled to the heat sink structure 104, 210 which is able to be coupled to the base 102 such that the circuitry 112 electrically couples with the die 108, 218 via the die substrate 110, in this case, the terminals 206 of the interposer 202. Consequently, the LED lighting device 100 is able to provide the advantage of cheaper cost due to cost savings from utilizing a single bendable interposer 202 which only requires inexpensive wirebonding to the LED die 218. Additionally, the device 100 provides savings due to the ability to omit the cavity 212 and/or indent 216 of the heat sink structure 210 and any fiducial marks because the aperture 208 of the interposer 202 facilitates easy alignment of the die 218.

Figure 3A:
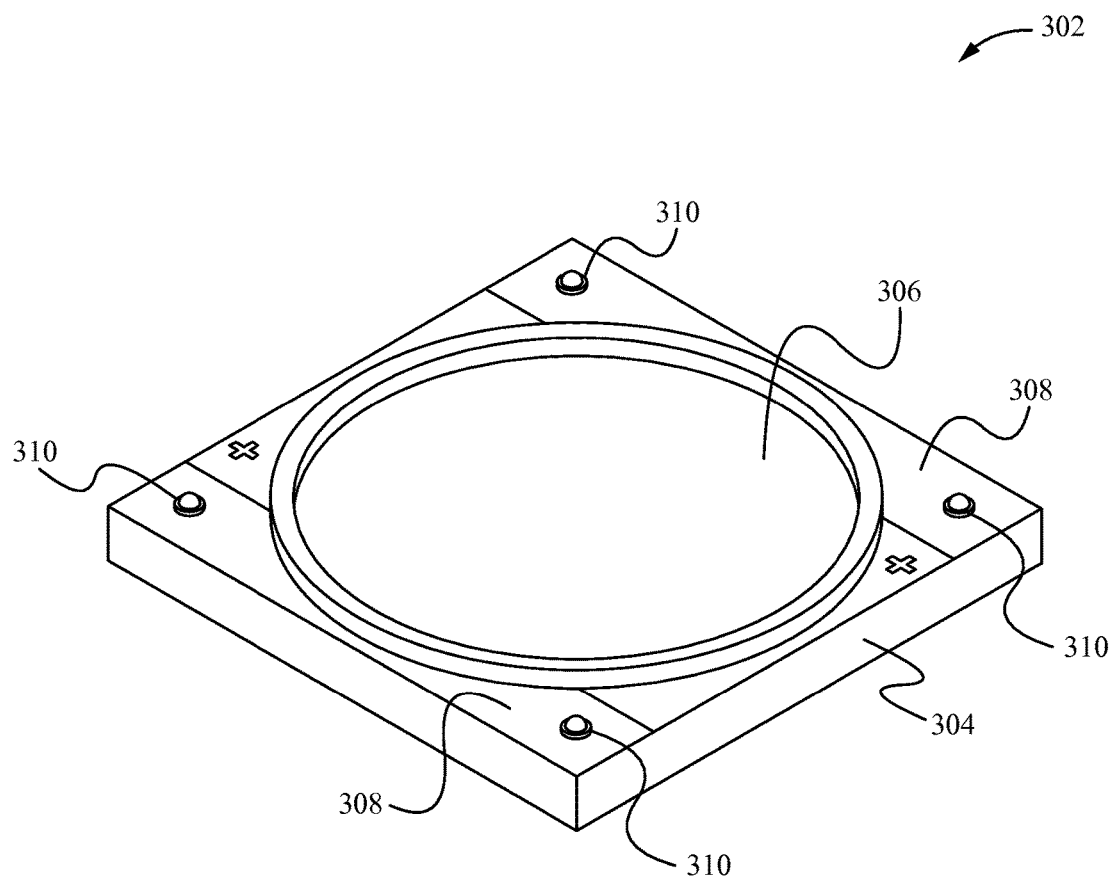
FIG. 3A illustrates a perspective view of an LED die comprising one or more stud bumps according to some embodiments.

FIGS. 3A-3F illustrate an alternate method of manufacturing or assembling an LED-lighting device 100 according to some embodiments. As shown in FIG. 3A, an LED die 302 comprises a body 304 including a light-emitting element 306 and one or more electrically conductive contact pads 308. Additionally, in contrast to the LED die 218 described above, the LED die 302 comprises one or more electrically conductive studs or bumps 310 on top of the contact pads 308. The light-emitting element 306 is electrically coupled with the contact pads 308 and bumps 310 such that the element 306 is able to receive electrical signals (e.g. power) via the one or more contact pads 308 and/or bumps 310 and operate (e.g. turn on and off) based on the received signals. Although as shown in FIG. 3A, the LED die 302 comprises two contact pads 308 and two bumps 310 on each pad 308, more or less contact pads 306 having more or less bumps 310 are contemplated. In some embodiments, the bumps 310 and/or contact pads 308 are gold. Alternatively, the bumps 310 and/or contact pads 308 are able to be one or a combination of gold, silver, nickel, copper, aluminum, palladium or other types of conductive materials well known in the art. In some embodiments, the bumps 310 have a height of or produce a standoff of 45 to 65 micrometers which provides the benefit of easier and/or more secure electrical contact with the laminate substrate (e.g. printed circuit board).

Figure 3C:
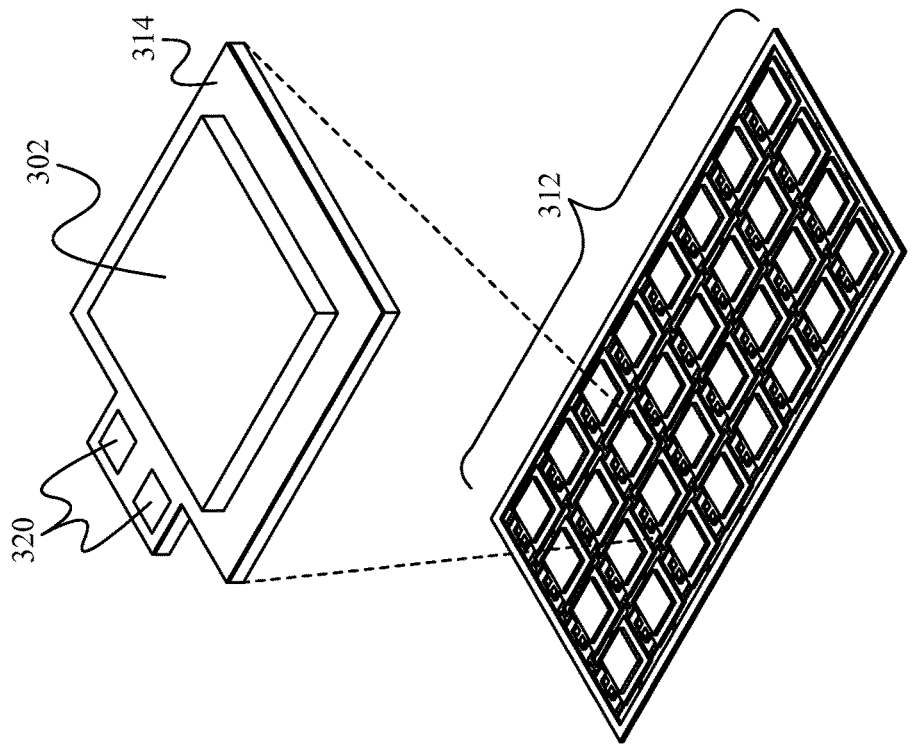
FIG. 3C illustrates a perspective view of the LED die and a die substrate panel post electrical bonding according to some embodiments.
Figure 3B:
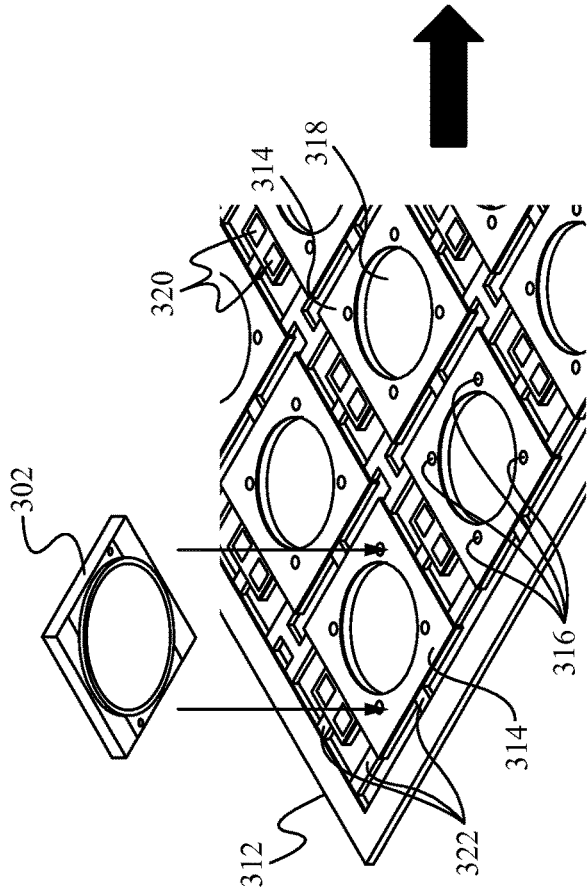
FIG. 3B illustrates a perspective view of the LED die and a die substrate panel pre electrical bonding according to some embodiments.

FIGS. 3B and 3C illustrate the LED die 302 and a die substrate panel 312 pre and post electrical bonding, respectively, according to some embodiments. As shown in FIG. 3B, the die substrate panel 312 comprises a plurality of die substrate units 314 coupled together via a plurality of support tabs 322 to form the panel 312. In some embodiments, the panel 312 and/or units 314 comprise a rigid laminate material such as a printed circuit board. In particular, this rigidity of the units 314 enables a plurality of the units 314 to be processed as a panel 312 in an array format thereby improving assembly efficiency and reducing manufacturing costs. Alternatively, the panel 312 and/or units 314 are able to comprise other types of rigid material. Each die substrate unit 314 is able to comprise an aperture 318, one or more conductive portions 316 and one or more terminals 320 protruding from the unit 314. Each of the terminals 320 is electrically coupled with one or more of conductive portions 316. For example, as shown in FIG. 3B, two of the conductive portions 316 are electrically coupled with each terminal 320. In some embodiments, the number of terminals 320 is equal to the number of contact pads 308 and the number of bumps 310 is equal to the number of conductive portions 316 such that each bump 310 is able to electrically couple to one of the conductive portions 316 thereby electrically coupling each one of the terminals 320 to a separate one of the contact pads. Alternatively, different numbers of contact pads 308, bumps 310, conductive portions 316 and/or terminals 320 are able to be used to effectuate the electrical coupling of the terminals 320 with the contact pads 308. In some embodiments, the conductive portions 316 are gold. Alternatively, the conductive portions 316 are able to be one or a combination of gold, silver, nickel, copper, aluminum, palladium or other types of conductive materials well known in the art.

The support tabs 322 are able to be weakened or have sufficiently small dimensions such that the units 314 are able to be easily separate from each other and/or the remainder of the panel 312. For example, in some embodiments the connection point between the tabs 322 and the units 314 is narrow such that breaking of the connection is able be effectuated by punching or otherwise providing force onto the units 314 to move them with respect to the tabs 322. The aperture 318 of each of the units 314 is able to have an outline, shape or perimeter the is the same, but slightly larger than the outline or perimeter of the light-emitting element 306. As a result, the light-emitting element 306 is able to fit within the aperture 318 when the respective perimeters are aligned and the die 302 is bonded to the unit 314. Additionally, as shown in FIG. 3B, the bumps 310 and/or the conductive portions 316 are positioned on the dies 302 and units 314, respectively, such that when the light-emitting element 306 is positioned within the aperture 318, the bumps 310 and conductive portions 316 are able to be aligned such that each of the bumps 310 contacts one of the conductive portions 316. As a result, as shown in FIG. 3C, each of the dies 302 is able to be electrically and/or physically bonded to one of the units 314 via the bumps 310 being electrically bonded to the conductive portions 316. Indeed, because this bond between the dies 302 and units 314 is a metallurgical bond, it that enhances the reliability of the die/unit performance. Alternatively, other types of bonds are able to be used.

Figure 3D:
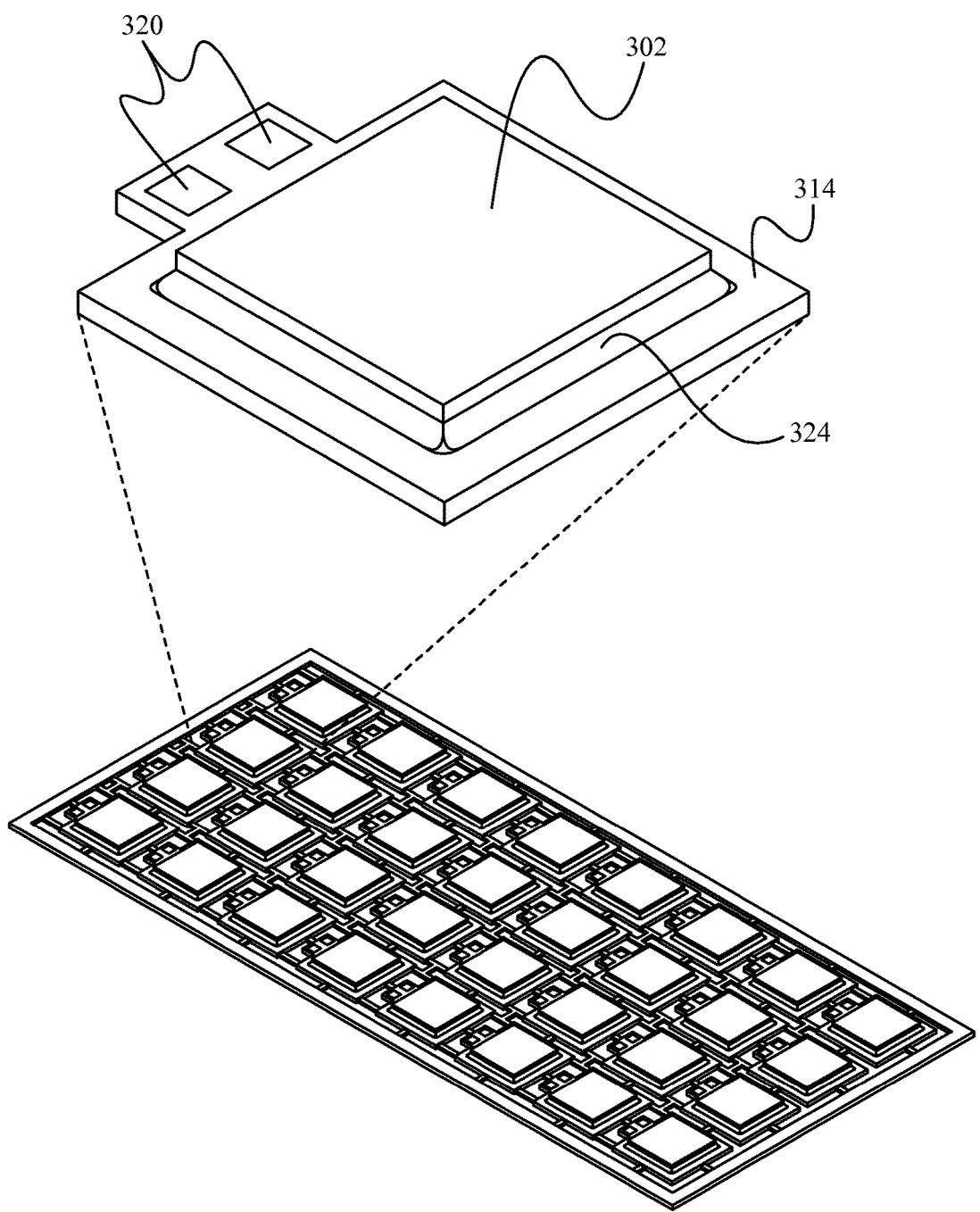
FIG. 3D illustrates a perspective view of the bonded die/unit panel of FIG. 3C having an underfill material according to some embodiments.
Figure 3E:
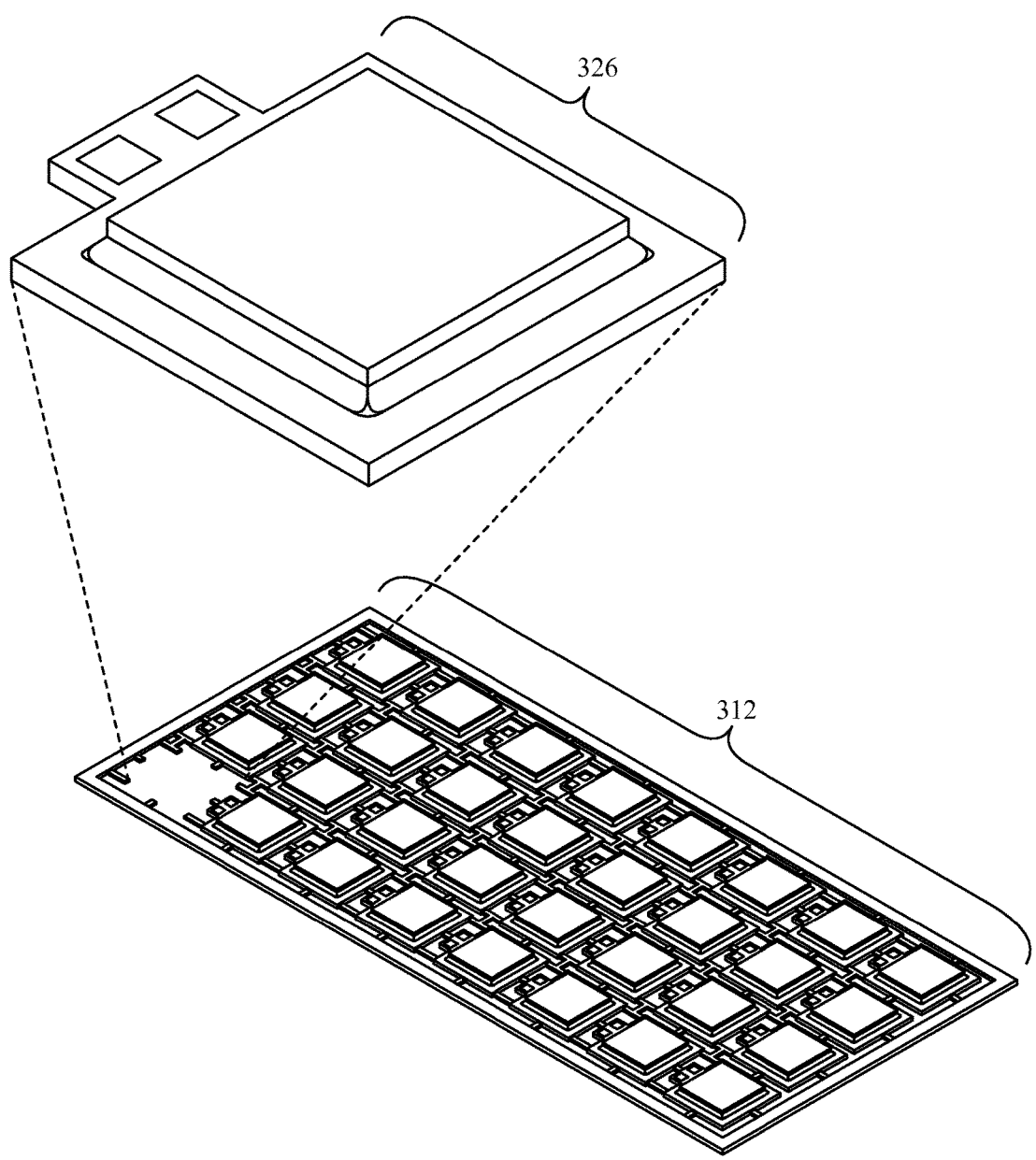
FIG. 3E illustrates a perspective view of the singulation of the bonded and underfilled dies/units from the panel of FIG. 3D according to some embodiments.

FIG. 3D illustrates the bonded die/unit panel of FIG. 3C having an underfill material according to some embodiments. As shown in FIG. 3D, the underfill material 324 is disposed in between the die 302 and the unit 314. Specifically, the underfill material 324 is able to fill in any gaps in between the die 302 and the unit 314 in order to enhance the physical coupling between the two as well as protect the electrical coupling between the bumps 310 and the conductive portions 316. In some embodiments, the underfill material 324 is an epoxy solution that is able to be cured such that it hardens and becomes rigid in order to protect the die 302 and the unit 314. Alternatively, the underfill material 324 is able to be other non-conductive protective materials well known in the art. FIG. 3E illustrates the singulation of the bonded and underfilled dies/units from the panel of FIG. 3D according to some embodiments. Specifically, as described above, each of the units 314 and dies 302 that are bonded and underfilled together are able to be separated from the panel into singulated packages 326 by detaching each package 326 from the tabs 322. As shown in FIG. 3E, the panel 312 comprises a four by eight array of packages 326. Alternatively, a panel 312 is able to comprise more or less packages 326 in different sized and/or shaped arrays.

Figure 3G:
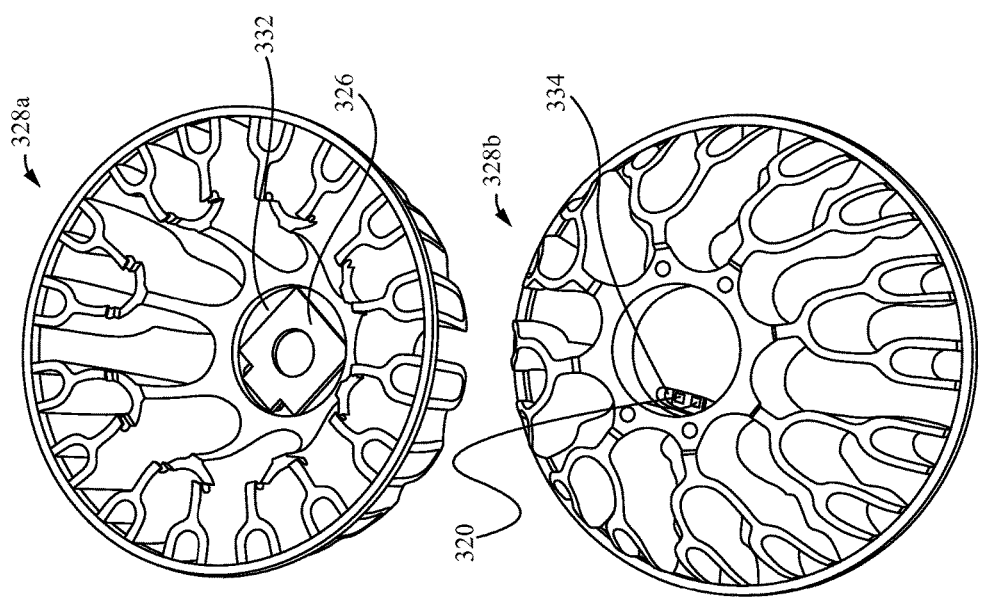
FIG. 3G illustrate a perspective view of the package and a heat sink structure after the package is bonded to the heat sink structure according to some embodiments.
Figure 3F:
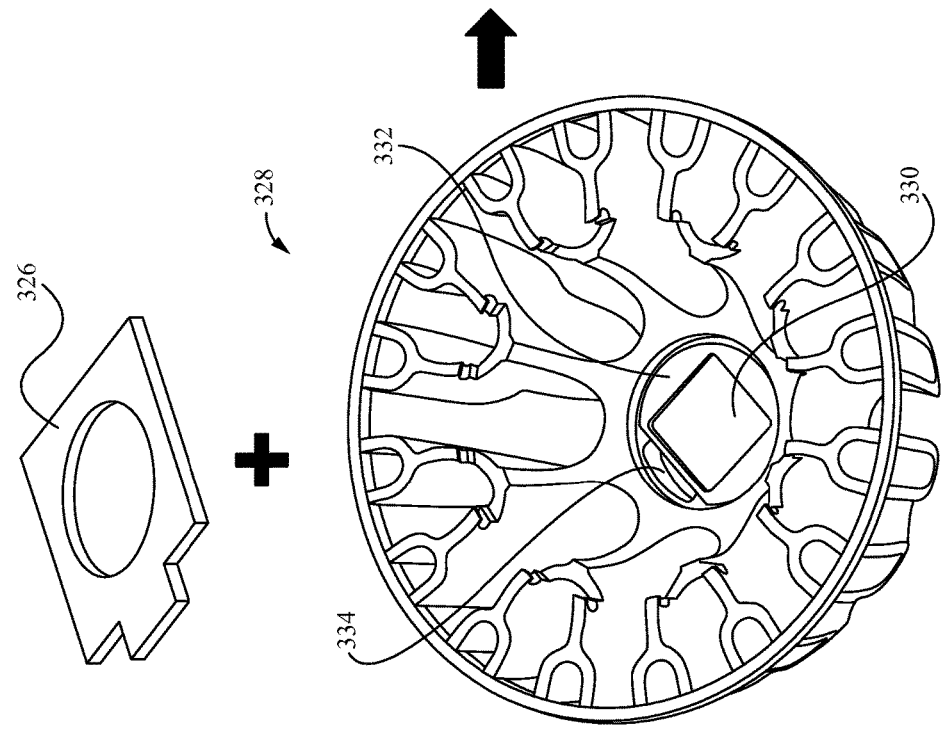
FIG. 3F illustrate a perspective view of the package and a heat sink structure before the package is bonded to the heat sink structure according to some embodiments.

FIGS. 3F and 3G illustrate the package 326 and a heat sink structure 328 before and after the package 326 is bonded to the heat sink structure 328 according to some embodiments. As shown in FIG. 3F, the heat sink structure 328 comprises a branching body surrounding an indent 332, a cavity 330 and a hole 334. The branching body of the structure 328 enables the heat sink structure 328 to more effectively absorb heat while also supporting the device 100. The cavity 330 and the hole 334 are able to be located within the indent 332 of the structure 328. In particular, the hole 334 is able to be positioned adjacent to the cavity 330 (near where the package 326 is located) in order to minimize the length necessary for the terminals 320 to extend such that they cover at least a portion of one end of the hole 334 and thus are accessible through the other end of the hole 334 as shown in FIG. 3G. Additionally, the cavity 330 is able to have a depth sufficient to enable the body 304 of the die 302 to fit within the cavity 330 (e.g. such that the portions of the unit 314 surrounding the die 302 contact the surface of indent 332 that surrounds the cavity 330). The cavity is also able to have a perimeter that is congruent with but slightly larger than the perimeter of the die 302. As a result, the body 304 is able to fit within the cavity 330 when their two perimeters are aligned as shown in FIG. 3G. Thus, the perimeter shape and depth of the cavity 330 provides the advantage of enabling the package 326 to be flush against the surface of the heat sink structure 328 as well as facilitating easier alignment of the package 326 relative to the hole 334 due to the limited orientations where the package 326 fits within the cavity 330.

Moreover, as shown in FIG. 3G, the LED die 302 is able to be physically coupled to the heat sink structure 328 while positioned within the cavity 330. In some embodiments, the die 302 is physically coupled via an adhesive disposed between the die 302 and the structure 328. Alternatively, the die 302 is able to be physically trapped or secured in place by another structure (e.g. lens/filter) or otherwise affixed relative to the structure 328. Alternatively, in some embodiments the indent 332 and/or the cavity 330 are able to be omitted. The indent 332 is able to be sized (e.g. have a depth and/or perimeter) to receive the package 326. In some embodiments, the perimeter of the indent 332 is able to be congruent with but larger than the perimeter of the package 326 to minimize the space between the two when coupled together. The hole 334 is able to extend through the body of the heat sink structure 328 to the other side opposite the indent 332 and/or cavity 330. Thus, the hole 334 provides a path for circuitry 112 to reach the terminals 320 (which cover a portion of one side of the hole 334) from the other side of the heat sink structure 328.

FIG. 3G illustrates a top 328a and bottom 328b perspective of the package 326 and the heat sink structure 328 physically coupled together according to some embodiments. As shown in FIG. 3G, the package 326 is positioned within the indent 332 of the heat sink 328 such that the terminals 320 are closest to the hole 334. The terminals 320 are aligned with or partially cover the end of one side of the hole 334 as shown by the top view 328a such that they are accessible through the hole 334 from the opposite side of the heat sink structure 328 as shown by the bottom view 328b. As a result, the terminals 320 of the package 326 are able to provide an electrical conduit from the die 302 on the top of the structure 328a to circuitry on the bottom of the structure 328b via the hole 334 such that the circuitry is able to be used to communicate with and/or control the die 302.

Figure 4:
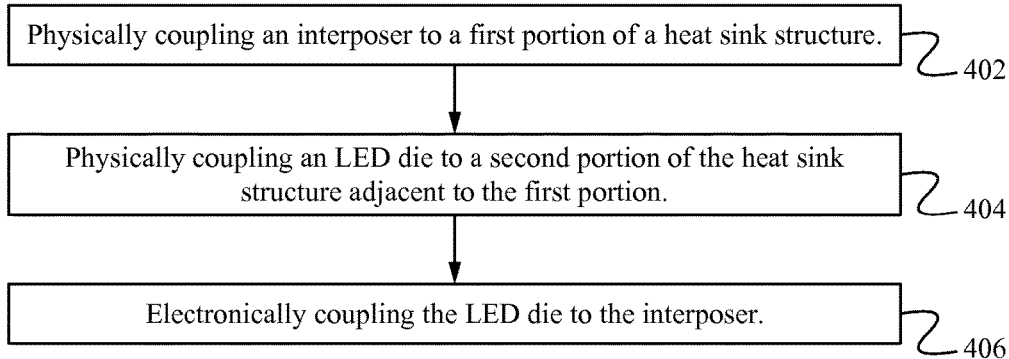
FIG. 4 illustrates a method of manufacturing an LED lighting device having an interposer according to some embodiments.

FIG. 4 illustrates a method of manufacturing an LED lighting device having an interposer according to some embodiments. At the step 402, an interposer 202 is physically coupled to a first portion of the heat sink structure 210. In some embodiments, the interposer 202 is able to be physically coupled to the heat sink 210 by threading the terminals 206 through the hole 214 and bending the terminals 206 such that they lay substantially flat on the bottom of the heat sink structure 210. Alternatively, the interposer 202 is able to be coupled to the heat sink structure 210 with one or a combination of an adhesive, a physical fastener or other affixing methods known in the art. In some embodiments, the first portion is an indent 216 of the heat sink structure 210. At the step 404, the LED die 218 is physically coupled to a second portion of the heat sink structure 210 adjacent to the first portion. In some embodiments, the die 218 is able to be bonded to the heat sink structure 210 with an adhesive. Alternatively, the die 218 is able to be coupled to the heat sink structure 210 by one or a combination of an adhesive, a physical fastener or other affixing methods known in the art In some embodiments, the second portion is a cavity 212 of the heat sink structure 210. At the step 406, the die 218 is electrically coupled to the interposer 202. In some embodiments, the electrically coupling of the LED die 218 to the interposer 202 comprises forming one or more wirebonds 226 between the LED die 218 and the interposer 202. Alternatively, other types of electrical coupling are able to be used such as solder bumps. In some embodiments, the method further comprises enveloping the wirebonds 226 in a protective glob 228. In some embodiments, the method further comprises physically coupling a secondary circuit 112 to the heat sink structure 210 such that one or more conductive contacts of the secondary circuit 112 electrically couple with one or more of the terminals 206 of the interposer 202.

Figure 5:
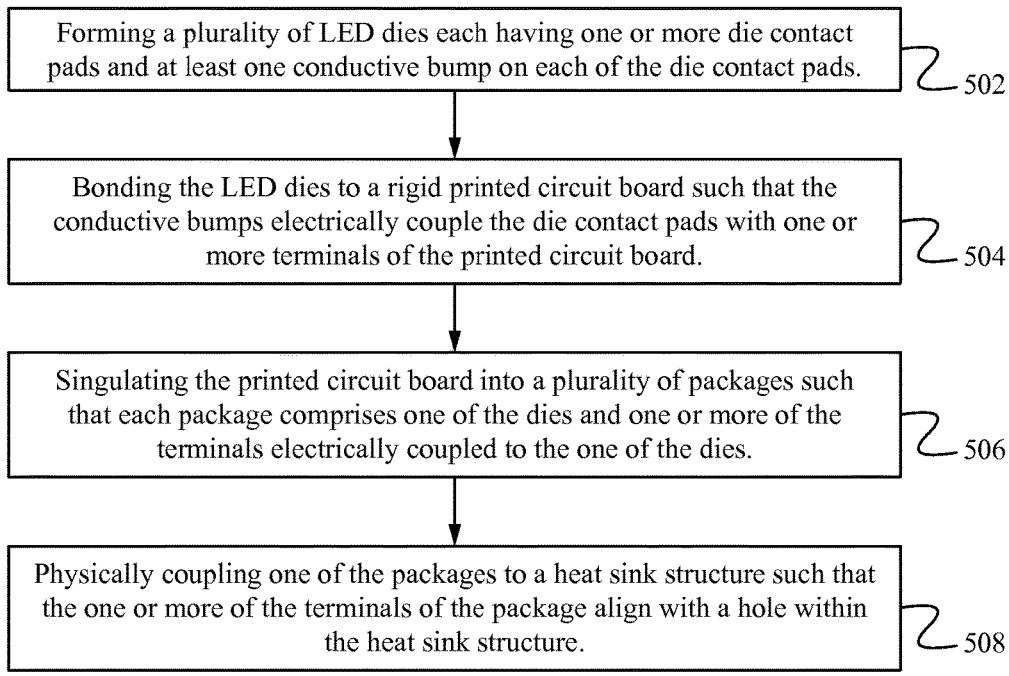
FIG. 5 illustrates a method of manufacturing an LED lighting device having a rigid die substrate according to some embodiments.

FIG. 5 illustrates a method of manufacturing an LED lighting device having a rigid die substrate according to some embodiments. At the step 502, a plurality of LED dies 302 are formed as a panel 312 each having one or more die contact pads 308 and at least one conductive bump 310 on each of the die contact pads 308. At the step 504, the LED dies 302 are bonded to a rigid printed circuit board 312, 314 such that the conductive bumps 310 electrically couple the die contact pads 308 with one or more terminals 320 of the printed circuit board 314. In some embodiments, thermo-sonic flip chip bonding is used to electrically bond each of the dies 302 to one of the units 314 via the bumps 310 and the conductive portions 316. Alternatively, other types of bonding are able to be used such as thermo-compression bonding. In some embodiments, the bonding of the LED die 302 to the printed circuit board 314 comprises aligning the conductive bumps 310 with one or more board contact pads 316 of the printed circuit board 314 while also aligning a light-emitting portion 306 of the die 302 with an aperture 318 within the printed circuit board 314. In some embodiments, the bonding of the LED die 302 to the printed circuit board 314 comprises filling the area in between the LED die 302 and the printed circuit board 314 with an underfill material 324 that seals the LED die 302 to the printed circuit board 314. At the step 506, the printed circuit board 312, 314 is singulated into a plurality of packages 326 such that each package 326 comprises one of the dies 302 and one or more of the terminals 320 electrically coupled to the one of the dies 302. In some embodiments, the singulating comprises punch singulation where the packages 326 are physically separated from the remainder of the panel 312 at one or more support stems 322. At the step 508, one of the packages 326 is physically coupled to a heat sink structure 328 such that the one or more of the terminals 320 of the package 326 align with a hole 334 within the heat sink structure 328. In some embodiments, the physically coupling the one of the packages 326 to the heat sink structure 328 comprises positioning the die 302 of the package 326 within a cavity 330 within the heat sink structure 328. In some embodiments, the method further comprises physically coupling a secondary circuit 112 to the heat sink structure 328 such that one or more conductive contacts of the secondary circuit 112 electrically couple with the one or more of the terminals 320 of the package 326 through the hole 334 of the heat sink structure 328.

The LED lighting device, system and method described herein has numerous advantages. Specifically, it provides the benefit of only requiring a single thin flexible interposer to electrically couple the LED die to the other circuitry which eliminates the necessity for hand soldering the die and circuitry together and reduces the cost of the device and its manufacture. Further, the wirebonding of the die to the interposer after both have been separately positioned and/or coupled to the heat sink is an inexpensive electrical coupling method. Additionally, by configuring the interposer and/or heat sink with a square or non-circular aperture/cavity, the system provides the advantage of removing the need for alignment marks as the alignment fit of the die into the aperture and/or cavity ensures alignment of the terminals with the heat sink structure hole. Also, the use of a rigid die substrate enables panelization of the production of the die/substrate units or packages which improves the assembly efficiency as well as reducing its cost. Moreover, the use of thermo-sonic bonding with underfill to electrically and physically couple the die and the substrate together increases the reliability of the unit/package as it creates stronger metallurgical bonding between the two. Finally, the use of stud bumps to electrically couple the die to the terminals of the substrate provide the advantage of enabling the package or unit to have a better standoff (e.g. 45 to 65 um) than is possible with the user of solder on the pad. Thus, the LED lighting device, system and method described herein has numerous advantages.

The present application has been described in terms of specific embodiments incorporating details to facilitate the understanding of the principles of construction and operation of the power converter. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A method of manufacturing an LED device, the method comprising:
    physically coupling an interposer to a first portion of a heat sink structure, the interposer comprising a thin and flexible flat sheet body, one or more terminals that form conductive conduits that extend away from the body, and an interpose aperture having an outline matching an outline of an LED die, the heat sink structure comprising an indent formed to receive the body of the interposer, a cavity formed within the indent to receive the LED die, and a hole adjacent to the first portion formed to receive the one or more terminals of the interposer;
    bending the one or more terminals through and around the heat sink hole to secure the interposer to a bottom surface of the heat sink;
    physically coupling the LED die to a second portion of the heat sink structure adjacent to the first portion, such that the interpose aperture aligns with the cavity of the heat sink structure when the LED die is coupled to the heat sink; and
    electrically coupling the LED die to the interposer.

2. The method of claim 1 wherein electrically coupling of the LED die to the interposer comprises forming one or more wirebonds between the LED die and the interposer.

3. The method of claim 2 further comprising enveloping the one or more wirebonds in a protective mold.

4. The method of claim 1 wherein the interpose aperture is square or rectangular such that the alignment of the LED die within the interpose aperture is limited.

5. The method of claim 1 further comprising physically coupling a secondary circuit to the heat sink structure such that one or more conductive contacts of the secondary circuit electrically couple with one or more of the terminals of the interposer.

6. An LED lighting device comprising:
 a heat sink structure comprising an indent and a cavity formed within the indent;
 an interposer comprising a thin and flexible flat sheet body and an interposer aperture having an interposer perimeter matching a heat sink cavity perimeter, physically coupled within the heat sink indent to a first portion of the heat sink structure;
 an LED die physically coupled to a second portion of the heat sink structure adjacent to the first portion through the interposer perimeter and the heat sink cavity perimeter, the LED die having an outer perimeter such that the interposer aperture perimeter aligns congruently with the heat sink cavity perimeter when the LED die is coupled to the second portion of heat sink; and
 one or more conductors that electrically couple the LED die to the interposer.

7. The device of claim 6 wherein the one or more conductors comprise one or more wirebonds.

8. The device of claim 7 further comprising protective mold bumps that envelope each of the one or more wirebonds.

9. The device of claim 6 wherein the interposer aperture perimeter is square or rectangular.

10. The device of claim 6 wherein the interposer comprises one or more terminals that form conductive conduits that extend away from the body for electrically coupling to a second circuit.

11. The device of claim 10 wherein the one or more terminals are threaded through a hole within the heat sink structure adjacent to the first portion.

12. The device of claim 11 further comprising a secondary circuit physically coupled to the heat sink structure and having one or more conductive contacts that are electrically coupled with one or more of the terminals of the interposer.

* * * * *